United States Patent
Sahar (10) Patent No.: US 9,678,523 B2
(45) Date of Patent: Jun. 13, 2017

(54) SELF BIASING DRIVER CIRCUIT FOR VOLTAGE BOOSTING

(71) Applicant: Microsoft Technology Licensing, LLC, Redmond, WA (US)

(72) Inventor: Ran Sahar, Natania (IL)

(73) Assignee: Microsoft Technology Licensing, LLC, Redmond, VA (US)

( * ) Notice: Subject to any disclaimer, the term of this patent is extended or adjusted under 35 U.S.C. 154(b) by 0 days.

(21) Appl. No.: 14/883,671

(22) Filed: Oct. 15, 2015

(65) Prior Publication Data
US 2017/0108889 A1 Apr. 20, 2017

(51) Int. Cl.
*G05F 1/10* (2006.01)
*G05F 3/02* (2006.01)
*H03K 17/687* (2006.01)

(52) U.S. Cl.
CPC ............ *G05F 3/02* (2013.01); *H03K 17/687* (2013.01)

(58) Field of Classification Search
USPC ........ 327/108, 110–111, 306, 313, 389–390, 327/536, 538, 589
See application file for complete search history.

(56) References Cited

U.S. PATENT DOCUMENTS

| 5,801,577 A | 9/1998 | Tailliet | |
|---|---|---|---|
| 6,023,187 A * | 2/2000 | Camacho | H02M 3/073 327/536 |
| 6,538,936 B2 * | 3/2003 | Tanaka | G11C 29/02 365/201 |
| 7,602,231 B2 | 10/2009 | Yamamoto et al. | |

FOREIGN PATENT DOCUMENTS

| EP | 0582125 | 2/1994 |
|---|---|---|
| EP | 2315213 | 4/2011 |

OTHER PUBLICATIONS

International Search Report and the Written Opinion Dated Jan. 30, 2017 From the International Searching Authority Re. Application No. PCT/US2016/055093. (13 Pages).

* cited by examiner

*Primary Examiner* — An Luu
(74) *Attorney, Agent, or Firm* — Qudus Olaniran; Bahram Ali; Micky Minhas (57) ABSTRACT

A driver circuit for voltage boosting comprises a plurality of circuit cells, each configured to amplify voltage applied thereto; and a plurality of inter-cell switching circuits, arranged to controllably concatenate the cells in series such that, for any pair of adjacent cells, voltage amplified by one cell of the pair is applied, via a respective inter-cell switching circuit, to another cell of the pair. At least one of the inter-cell switching circuits comprises a transistor and a capacitor connected in parallel to each other such that a source-gate voltage of the transistor equals a voltage drop on the capacitor at all times.

19 Claims, 6 Drawing Sheets

SELF BIASING DRIVER CIRCUIT FOR VOLTAGE BOOSTING

BACKGROUND

Voltage boosting circuits are especially useful in integrated circuits that require the generation and maintenance of a boosted signal having a voltage exceeding the power supply voltage.

To supply boosted voltages, voltage boosting drivers have been used. A typical voltage boosting driver consists of N concatenated voltage amplification cells. Each cell (except the first cell) receives, as input, output voltage of the preceding cell and amplifies that voltage. The first cell receives input voltage from an external source so that at the output of the last cell, the input voltage is amplified N times. The voltage amplification cells are controlled by control signals selected according to a predetermined charge sharing scheme.

SUMMARY

According to some embodiments of the present disclosure there is provided a driver circuit for voltage boosting. The driver circuit comprises a plurality of circuit cells. Each of the circuit cells amplifies voltage applied thereto. The circuit cells are concatenated in series such that, for any pair of adjacent cells, voltage amplified by one cell of the pair is applied to another cell of the pair. The driver circuit may additionally comprise a plurality of inter-cell switching circuits. Each inter-cell switching circuit is arranged to controllably allow or prevent the application of amplified voltage among adjacent cells. In various exemplary embodiments of the disclosure, one or more of the inter-cell switching circuits comprises a transistor and a capacitor connected in parallel to each other such that a source-gate voltage of the transistor equals a voltage drop on the capacitor at all times. Optionally and preferably, the voltage across the capacitors gradually increases as one moves along the series towards the last amplification stage at which a load is typically applied.

According to some embodiments of the present disclosure there is provided a switching circuit for a voltage boost driver. The switching circuit comprises a transistor, a capacitor and an arrangement of switches. The capacitor can be connected between a gate terminal and a source terminal of the transistor, and the arrangement of switches can connect the source terminal to a reference line and the gate terminal to a supply line. The reference line is at a reference potential, and the supply line can supply a voltage relative to the reference potential.

According to some embodiments of the present disclosure there is provided a voltage boosting system. The voltage boosting system comprises the driver circuit as delineated hereinabove and optionally and preferably as further detailed below, and a controller. The controller transmits synchronized control signals to the cells and the inter-cell switching circuits. The transmitted control signals serve for connecting and disconnecting the cells to a voltage supply terminal, and for connecting and disconnecting the cells from each other.

According to some embodiments of the present disclosure there is provided a method suitable for boosting voltage supplied by a voltage source via a voltage supply terminal. The method comprises transmitting synchronized control signals to the circuit cells and the inter-cell switching circuits of the driver circuit, the synchronized control signals being used for connecting and disconnecting the cells to the voltage supply terminal, and for connecting and disconnecting the cells from each other.

The method can, in some embodiments of the present disclosure, be executed to operate an appliance system having therein a voltage source supplying a supply voltage that is lower than the minimum voltage required for operating the appliance system. In these embodiments, the method is executed so as to boost the supply voltage to a voltage which is at least the minimum voltage. Some embodiments of the present disclosure provide an appliance system that includes the voltage boosting system.

Representative examples of appliance systems suitable for the present embodiments include, without limitation, an electrostatic pen system for a touch screen, a memory system, a laser pointer system, and a camera having a flash lamp.

One or more of the inter-cell switching circuits of the driver of the present embodiments can comprise two switches, in addition to the transistor and capacitor. These switches are optionally and preferably configured to controllably charge and discharge the capacitor. For example, in some embodiments, the capacitor is discharged when a first switch is open and a second switch is closed, and is charged when the first switch is closed and the second switch is open. In these embodiments, one terminal of the capacitor is optionally and preferably connected to the voltage supply terminal of the respective cell via the first switch and to a reference point (e.g., a grounded reference point) via the second switch. The other terminal of the capacitor is connected, optionally and preferably at all times, to an input voltage terminal of the respective cell.

Optionally, each circuit cell comprises one or more intra-cell switches for controllably charging the cell by electrical charge prior to the application of amplified voltages among adjacent cells.

Unless otherwise defined, all technical and/or scientific terms used herein have the same meaning as commonly understood by one of ordinary skill in the art. Although methods and materials similar or equivalent to those described herein can be used in the practice or testing of embodiments of the disclosure, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWINGS

Some embodiments of the disclosure are herein described, by way of example only, with reference to the accompanying drawings. With specific reference now to the drawings in detail, it is stressed that the particulars shown are by way of example and for purposes of illustrative discussion of embodiments of the disclosure. In this regard, the description taken with the drawings makes apparent to those skilled in the art how embodiments of the disclosure may be practiced.

In the drawings.

DETAILED DESCRIPTION

Some embodiments of the present disclosure provide a driver circuit for voltage boosting. The driver circuit comprises a plurality of circuit cells, each being capable of amplifying voltage applied thereto. The circuit cells are concatenated in series such that, for any pair of adjacent cells, voltage amplified by one cell of the pair is applied to another cell of the pair.

In a conventional driver circuit for voltage boosting, a relatively high amount of power is required for managing the charge sharing among the circuit cells. For example, some driver circuits employ level shifters for maintaining sufficient bias voltage on gates of transistors serving as switches. Such level shifters consume a significant amount of current. A driver circuit is therefore described in which the power used for managing the charge sharing may be significantly small, for example, less than 5% or less than 4% or less than 3% or less than 2% or less than 1% per circuit cell. This is unlike conventional driver circuits where the power used for managing the charge sharing typically requires more than 20% per circuit cell.

The driver circuit of the present embodiments typically comprises a plurality of inter-cell switching circuits, wherein each inter-cell switching circuit controllably allows or prevents the application of amplified voltage among adjacent cells. One or more of the inter-cell switching circuits is optionally and preferably self-biased. Such a configuration allows keeping the electrical communications among the circuit cells, via the inter-cell switching circuits, with reduced or substantially no excessive power consumption.

A self-biased switching circuit according to some embodiments of the present disclosure can comprise a transistor and a capacitor connected in parallel to each other. For example, the capacitor can be connected such that a source-gate voltage of the transistor equals a voltage drop on the capacitor at all times. The switching circuit of the present embodiments can also comprise an arrangement of switches for connecting the source terminal of the transistor to a reference line and the gate terminal to a supply line. Since the switching circuit of the present embodiments is self-biased, it is not necessary for the switching circuit to include a level shifter. Thus, in various exemplary embodiments of the disclosure, the self-biased switching circuit is devoid of a level shifter. These embodiments are advantageous because they reduce the amount of current that is consumed by the switching circuit.

For example, in typical operative conditions of about 250 kHz in frequency and about 2 volts in supply voltage, a typical level shifter consumes electrical current of about 1 μA. Under the same conditions, a self-biased switching circuit which includes a transistor and a capacitor between the gate and the source of the transistor consumes electrical current of about 50 nA. Thus, in typical operative conditions the current consumed by the self-biased switching circuit of the present embodiments is 20 times smaller than the current consumed by a level shifter.

Before explaining at least one embodiment of the exemplary embodiments in detail, it is to be understood that the disclosure is not necessarily limited in its application to the details of construction and the arrangement of the components and/or methods set forth in the following description and/or illustrated in the drawings and/or the Examples. The disclosure is capable of other embodiments or of being practiced or carried out in various ways.

Figure 1:
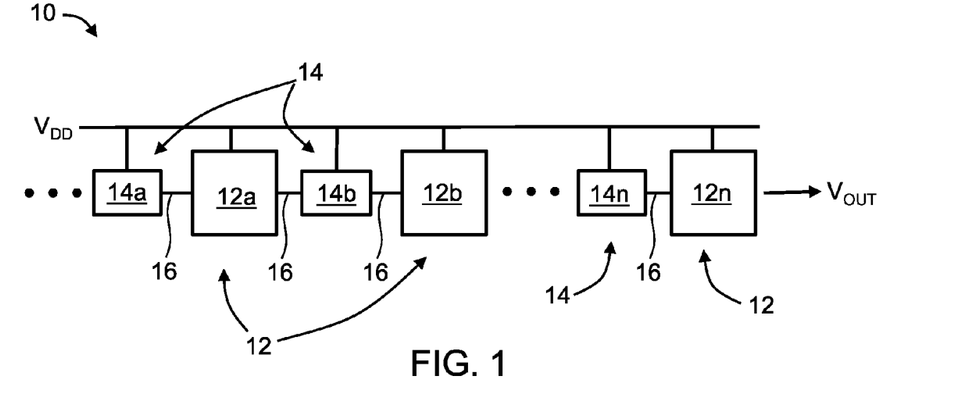
FIG. 1 is a block diagram illustrating a driver circuit 10 for voltage boosting, according to some embodiments of the present disclosure.

Referring now to the drawings, FIG. 1 is a block diagram illustrating a driver circuit 10 for voltage boosting, according to some embodiments of the present disclosure. Driver circuit 10 comprises a plurality of circuit cells 12, and a plurality of inter-cell switching circuits 14. Driver circuit 10 can comprise any number of cells, provided there is a plurality of cells. Thus, driver circuit 10 can comprise at least 2 cells and possibly at least 9 or 10 cells. Typically, but not necessarily, there are 15 cells or more in driver circuit 10. The last circuit cell in the series is denoted 12n, and the last inter-cell switching circuit is denoted 14n.

Circuit cells 12 are configured to amplify voltage, wherein the ith cell amplifies the intermediate output voltage of the i−1 cell. Inter-cell switching circuits 14 are arranged to controllably concatenate cells 12 in series such that, for any pair of adjacent cells (e.g., cells 12a and 12b, in FIG. 1), voltage amplified by cell 12a is applied, via a respective inter-cell switching circuit (e.g., inter-cell switching circuit 14b, in FIG. 1) to cell 12b. Lines by which voltage is applied by one cell to the other are shown at 16.

In various exemplary embodiments of the disclosure each cell also receives supply voltage $V_{DD}$. $V_{DD}$ is typically used for electrically charging cells 12 thereby allowing them to amplify the voltage. This can be better understood with reference to FIG. 2A which is a simplified schematic illustration of two cells 12a and 12b of driver circuit 10, according to some embodiments of the present disclosure.

Figure 2A:
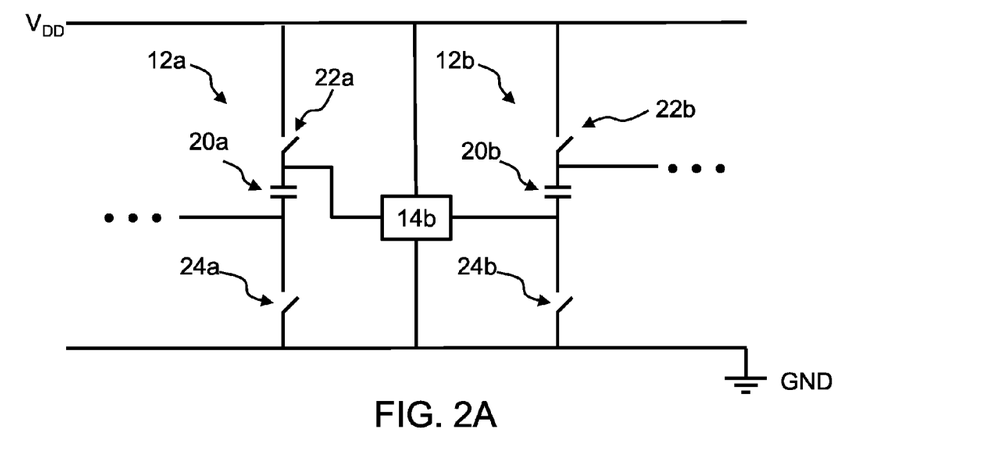
FIG. 2A is a simplified schematic illustration of two cells and of the driver circuit, according to some embodiments of the present disclosure.

Each of cells 12a and 12b is schematically illustrated as comprising a capacitor, where the capacitor of cell 12a is designated 20a and the capacitor of cell 12b is designated 20b.

As used herein, "capacitor" refers to any electronic component or electronic circuitry that is capable of storing electrical charge responsively to a voltage applied thereto, and which generally does not transmit direct current therethrough as a result of this applied voltage.

As a representative example, which is not to be considered as limiting, a field effect transistor (FET) can serve as a capacitor by connecting its drain, source and bulk terminals, and biasing its gate terminal. Also contemplated is the use of N-well or P-well structures. Specifically, a capacitor according to some embodiments of the present disclosure can be a transistor built within an N-well or within a P-well. The advantage of these embodiments is that they allow biasing the transistor at a voltage that is higher than the characteristic bias voltage of the transistor when not built within an N-well or within a P-well. Such configuration provides an efficient capacitor with low area and relatively high voltage biasing (for example, about 2 volts higher).

As will be appreciated by one having an ordinary skill in the art of electronic circuits, a transistor in which the drain and the source terminals are not maintained at the same electrical potential, cannot function, by itself, as a capacitor. For example, some circuit elements include a transistor in which the gate terminal is connected to the source or drain terminal while the other terminal (drain or source) is at a different potential than the gate. Such circuit elements can function as a diode, but are generally incapable of storing charge. Thus, in various exemplary embodiments of the disclosure the term "capacitor" excludes transistors in which the drain and the source terminals are not maintained at the same electrical potential.

In some embodiments of the present disclosure, each of cells $12a$ and $12b$ comprises controllable intra-cell switches that allow applying voltage to capacitors $20a$ and $20b$.

As used herein, "switch" refers to any electronic element or electronic circuitry that has a binary switching functionality. A representative example of such electronic element is a transistor, when operated digitally.

Two intra-cell switches are shown in each of cells $12a$ and $12b$. A first switch $22a$, $22b$ connects and disconnects one terminal of the capacitor $20a$, $20b$ to supply voltage $V_{DD}$, and a second switch $24a$, $24b$ connects and disconnects the other terminal of the capacitor $20a$, $20b$ to a reference point (e.g., ground GND, in FIG. 2A).

Figure 2B:
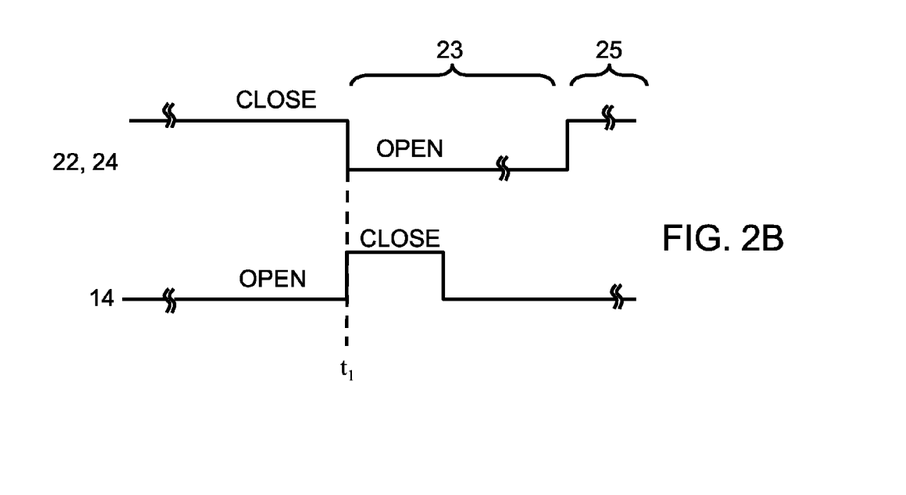
FIGS. 2B and 2C are schematic illustrations of control signals that can be transmitted to cells and inter-cell switching circuits according to some embodiments of the present disclosure.

A schematic illustration of control signals that can be transmitted according to some embodiments of the present disclosure in a buildup period of a single voltage boost cycle to switches 22, 24 as well as to inter-cell switching circuit 14 is provided in FIG. 2B.

As used herein "voltage boost cycle" refers to a cycle in which the voltage is increased to reach a predetermined level, and is then decreased to restore its initial level. The period of time during which the voltage is increased is referred to as "the buildup period of the voltage boost cycle," and the period of time during which the voltage is decreased is referred to as "the fall-off period of the voltage boost cycle."

At time $t<t_1$ within the voltage boost cycle shown in FIG. 2B, both switches 22 and 24 are in a closed state while inter-cell switching circuit 14 is in an open state (namely capacitors $20a$ and $20b$ of cells $12a$ and $12b$ are disconnected from each other). This charges capacitors 20 by electrical charge that is proportional to the potential difference between the $V_{DD}$ terminal and the reference point. For example, when this potential difference equals $V_{DD}$, each of the capacitors 20 stores electrical charge of $C \cdot V_{DD}$, where C is the characteristic capacitance of the respective capacitor.

Typically, but not necessarily, $V_{DD}$ is from about 1 volt to about 5 volts or from about 1.5 volts to about 4 volts or from about 1.5 volt to about 3 volts or from about 1.5 volts to about 2.5 volts or from about 1.7 volts to about 2.3 volts (e.g., about 2 volts), and C is from about 80 pF to about 300 pF or from about 80 pF to about 200 pF or from about 100 pF to about 200 pF (e.g., about 120 pF), but other values are also contemplated in any of the disclosed embodiments.

At time $t>t_1$ within the buildup period 23 of the voltage boost cycle shown in FIG. 2B, both switches 22 and 24 are in an open state (namely the capacitors 20 are disconnected from the terminals of the supply line $V_{DD}$ and from the reference points), while inter-cell switching circuit 14 is brought to a closed state. In this electrical configuration, capacitors 20 are essentially connected in series to each other, thereby achieving a voltage boost, since the effective capacitance is reduced. The output voltage $V_{OUT}$ of driver circuit 10 (the output of the last cell $12n$, see FIG. 1) is therefore higher than $V_{DD}$, and the degree of amplification increases as the number of amplification cells 14 increases. For small or no external load, $V_{OUT}$ can be approximately $N \times V_{DD}$, where N is the number of cells 12 in driver circuit 10. For higher external load (e.g., of about 10 pF), $V_{OUT}$ can be approximately $0.66N \times V_{DD}$. During the fall-off period 25 of the voltage boost cycle shown in FIG. 2B, both switches 22 and 24 are brought to their close state, thereby allowing the voltage to restore its original level.

Figure 2C:
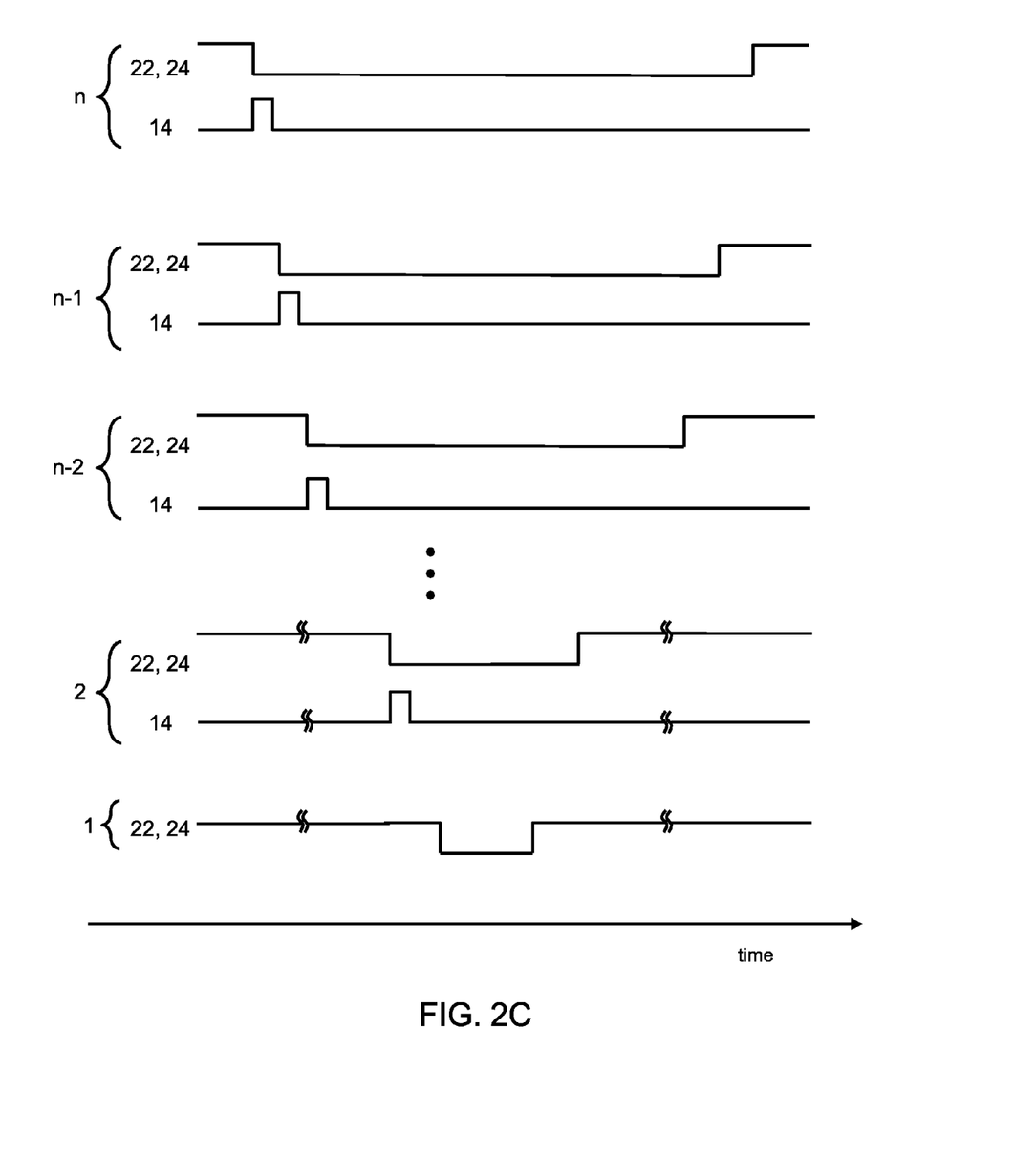

The control signals that are schematically described in FIG. 2B define buildup 23 and fall-off 25 periods per one cell. In various exemplary embodiments of the disclosure all the cells and inter-cell switching circuits of driver circuit 10 receive control signals as schematically described in FIG. 2B except that there is an overall time shift among different cells. Typically, switches 22 and 24 are opened for cell i after the inter-cell switching circuit 14 of cell i+1 is reopened within the voltage boost cycle, where cell i+1 amplifies the voltage of cell i. Thus, control signals are firstly transmitted to operate cell $12n$ and inter-cell switching circuit $14n$, secondly to operate cell $12_{n-1}$ and inter-cell switching circuit $14_{n-1}$, and so on. A set of control signals suitable for the entire driver circuit according to some embodiments of the present disclosure is illustrated in FIG. 2C. The cycles of control signals are labeled "n", "n−1", "n−2", . . . , "2" and "1" in correspondence with the cell and inter-cell switching circuit numbers that receive the control signals of the respective cycle. Note that since there is no inter-cell switching circuit before the first cell of the series, the cycle "1" does not have control signals to inter-cell switching circuit 14.

The above procedure is preferably repeated at a frequency selected according to the appliance system that is operated by the output voltage $V_{OUT}$. Typically, but not necessarily, the procedure is repeated at a frequency of from about 1 kHz to about 10 MHz, or from about 10 kHz to about 10 MHz, or from about 50 kHz to about 10 MHz, or from about 50 kHz to about 5 MHz. Such frequencies are useful, for example, when $V_{OUT}$ is utilized for operating an electrostatic pen of a touch screen.

To obtain a configuration that reduces the power consumed by repeatedly activating and deactivating the inter-cell switching circuits 14, it may be advantageous to allow self-biasing of these switching circuits. The use of self-biased switching circuits may significantly reduce the number of toggling operations that are required for achieving voltage boosting. In a driver circuit with self-biased switching circuits, according to some embodiments of the present disclosure, a single toggling is required, irrespective of the number of the cells in the driver circuit. This is unlike conventional driver circuits in which the number of toggling operations per single voltage step grows linearly with the number of amplification stages. Such a reduction in the required number of toggling operations may significantly reduce the power consumption of the driver circuit.

One way to provide switching circuit 14 with a self-biasing property is to connect a capacitor and a transistor in parallel, as will now be explained with reference to FIGS. 3A and 3B. Use of a capacitor in parallel to a transistor as described below is contemplated for any of the embodiments described herein.

Figure 3A:
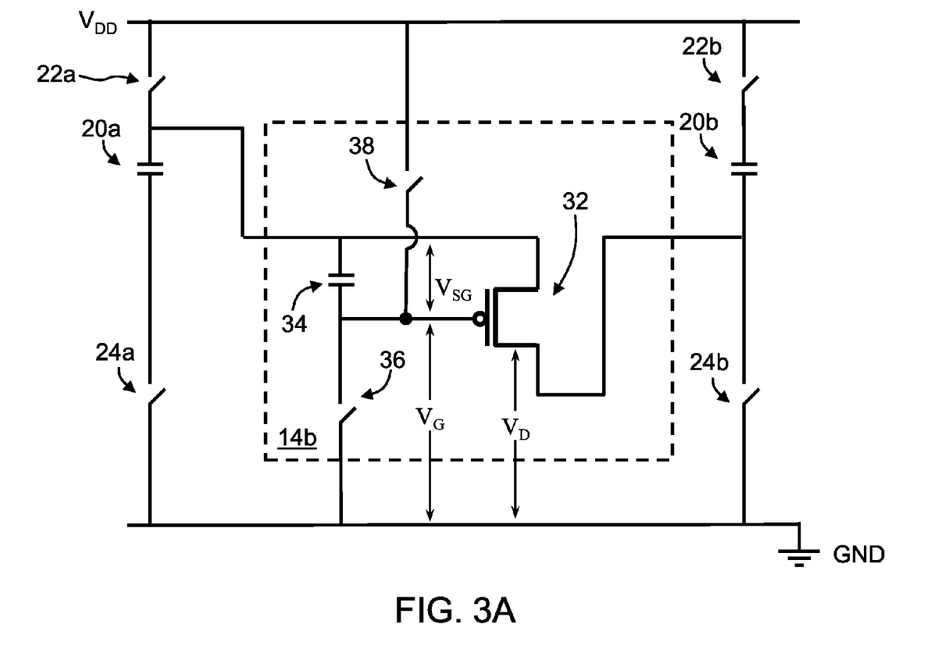
FIG. 3A is a schematic illustration showing an inter-cell switching circuit in greater detail, according to some embodiments of the present disclosure.

FIG. 3A is a schematic illustration showing inter-cell switching circuit $14b$ in detail, according to some embodiments of the present disclosure. The other inter-cell switching circuits 14 of driver are typically similar in their components. In the following description, the reference sign "a" is omitted from the components of the circuit 14, for clarity of presentation.

Inter-cell switching circuit 14 can comprise a transistor 32 and a capacitor 34 electrically connected in parallel to each other such that the source-gate voltage $V_{SG}$ of transistor 32 equals the voltage drop on capacitor 34 at all times. The gate voltage of transistor 32 is denoted $V_G$ and drain voltage of transistor 32 is denoted $V_D$. In the representative illustration, which is not to be considered as limiting, transistor 32 is symbolized as a pFET, but this need not necessarily be the case, since, for some applications, it may not be necessary for transistor 32 to be a pFET. Other types of transistors, for example, nFET can also be employed. Preferably, but not obligatorily, transistor 32 is of the MOSFET type.

Capacitor 34 can be embodied as an electronic component or electronic circuitry, such as, but not limited to, a transistor, and may optionally be provided within a p-well or n-well structure as further detailed hereinabove. Typically, the capacitance of capacitor 34 is from about 1 pF to about 10 pF, or from about 1 pF to about 5 pF, or from about 1 pF to about 4 pF, or from about 1 pF to about 3 pF, or from about 1 pF to about 2 pF, e.g., about 1.6 pF.

Inter-cell switching circuit 14 can also comprise one or more switches. For example, an arrangement of switches can connect the source and gate terminals of transistor 32 to a reference line (e.g., the ground point GND) and a supply line (e.g., $V_{DD}$), respectively. Two such switches 36 and 38 are illustrated in FIG. 3A. Each switch the arrangement (e.g., each of switches 36 and 38) can be any electronic element or electronic circuitry that has a binary switching functionality, such as, but not limited to, a digitally operated transistor. Switches 36 and 38 are optionally and preferably connected so as to controllably charge and discharge the capacitor 34. In the illustrated embodiment, which is not to be considered as limiting, switch 38 controls the electrical communication of the gate of transistor 32 to a terminal of the $V_{DD}$ line and switch 36 controls the electrical communication of the gate of transistor 32 with a terminal of the reference line (the ground point GND, in the present example).

In various exemplary embodiments of the disclosure, the activations of switches 36 and 38 are synchronized with the activations of switches 22 and 24, so that when switch 38 is in its closed state and switch 36 is in its open state, capacitor 34 is discharged, and when switch 38 is in its open state and switch 36 is in its closed state capacitor 34 is charged. This will now be explained in greater detail.

When switches 22 and 24 are in their closed state (namely when the voltage at 22 is $V_{DD}$), switch 38 is in its closed state and switch 36 is in its open state. This discharges capacitor 34 since both its terminals are at the same electrical potential (e.g., $V_{DD}$). At this state, transistor 32 is not biased (OFF state) because its source-gate voltage $V_{SG}$ equals zero.

When switches 22 and 24 are brought to their open state, switch 38 is opened and optionally and preferably remains open, while switch 36 is closed for a relatively short period of time Δt. Typically, but not necessarily, Δt is from a few (e.g., about 5) nanoseconds to a few hundreds of nanoseconds or from a few nanoseconds to 100 ns, or from about 10 ns to several tens of nanoseconds, e.g., for about 30 ns. During time-period Δt, the voltage drop on capacitor 34 approximately equals the voltage on the capacitor of the circuit cell that is at the input side of inter-cell switching circuit 14 (capacitor 20a, in the present example). Since at the time when switches 22 and 24 are opened, capacitors 20 are still electrically charged, the momentary closing of switch 36 charges capacitor 34. Typically, capacitor 34 is charged to a voltage of about $V_{DD}$, because capacitors 20 are also charged to $V_{DD}$, resulting in a source-gate voltage VSG of −VDD on transistor 32. This biases the transistor 32 (ON state) and therefore opens electrical communication between the cells at both sides of circuit 14 (cells 12a and 12b in the present example).

In various exemplary embodiments of the disclosure switch 36 is closed (optionally and preferably for a relatively short period of time Δt, as stated) only once during a single voltage boost cycle. This facilitates self-biasing in circuit 14 since when capacitor 34 is charged and switch 36 is in its open state, $V_{GS}$ traces the changes of its source terminal, thus keeping transistor 32 at its ON state. Such tracing is advantageous because it does not require additional power for biasing transistor 32. The voltage drop on the capacitors 34, hence also the bias on the transistors 32, varies automatically, without transmitting additional control signals to switches 36 and 38 during the cycle. The variation in voltage drop is exhibited both as a function of the location of the inter-cell switching circuit along the series of driver circuit 10), and as a function of the time (during the buildup and fall-off of $V_{OUT}$ at the beginning and end of the voltage boost cycle, respectively).

Figure 3B:
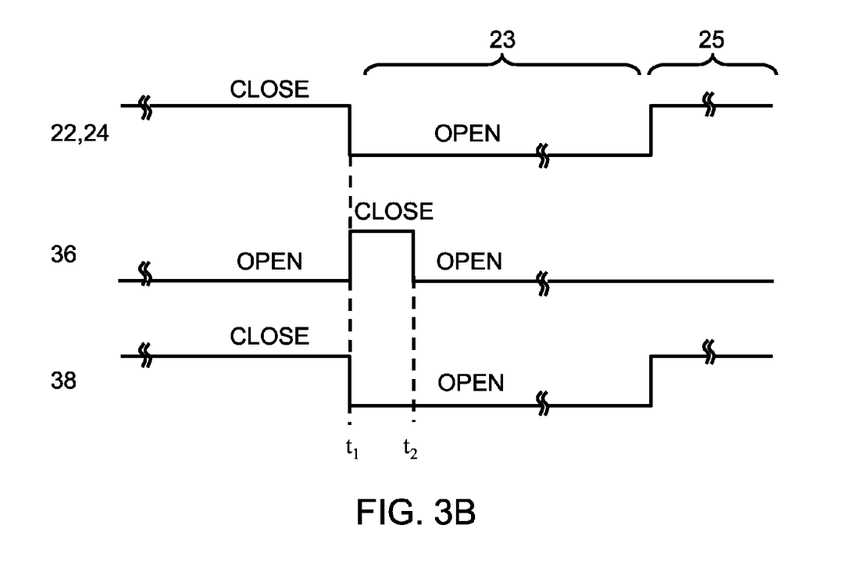
FIGS. 3B and 3C are schematic illustrations of control signals that can be transmitted to cells and switches within inter-cell switching circuits according to some embodiments of the present disclosure.

A schematic illustration of control signals that can be transmitted in a buildup period of a single voltage boost cycle to intra-cell switches 22, 24 as well as to switches 36 and 38 of inter-cell switching circuit 14 according to some embodiments of the present disclosure is provided in FIG. 3B.

At time t<$t_1$ within the voltage boost cycle, switches 22, 24 and 38 are in a closed state while switches 36 are in an open state. This charges capacitors 20 by electrical charge that is proportional to the potential difference between the $V_{DD}$ terminal and the reference point. This also discharges capacitors 34, and brings transistors 32 to their OFF state because at this configuration there is no voltage drop on capacitors 34. At time t>$t_1$ within the buildup period 23 of the voltage boost cycle, switches 22, 24 and 38 are in an open state and remain open until the end of buildup period 23 of the voltage boost cycle. Switches 36 are brought to their closed state at time $t_1$, opened at time $t_2$=$t_1$+Δt, and remains open until the end of the voltage boost cycle. During the time-period Δt, capacitors 34 are charged, and transistors 32 are biased to their ON state, while for any time t>$t_2$, until the end of the voltage boost cycle, self-biasing is exhibited, as further detailed hereinabove. During the fall-off period 25 of the voltage boost cycle shown in FIG. 3B, switches 22, 24 and 38 are brought to their close state, thereby allowing the voltage to restore its original level.

Figure 3C:
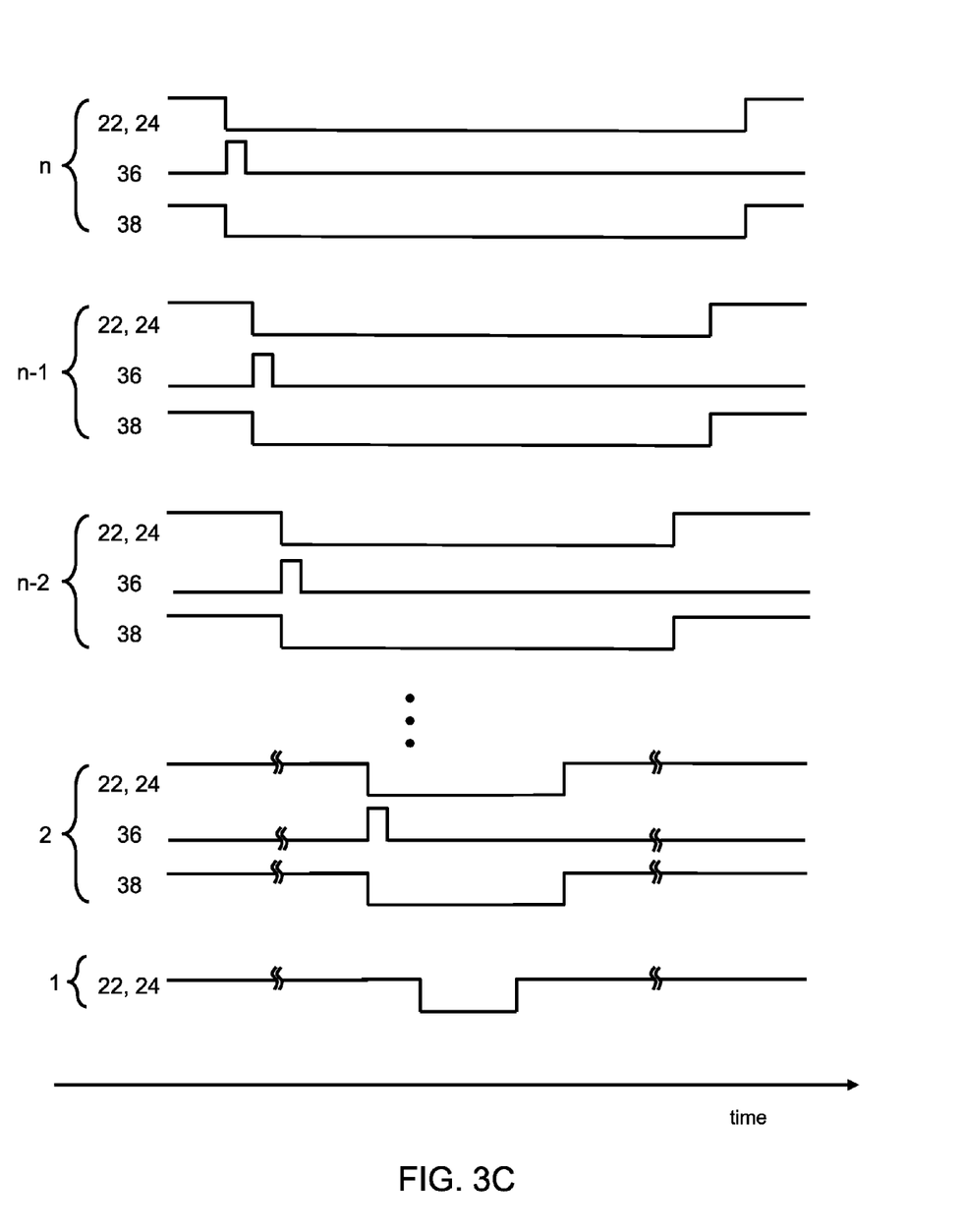

The control signals that are schematically described in FIG. 3B define buildup 23 and fall-off 25 periods of a voltage boost cycle per one cell. In various exemplary embodiments of the disclosure all the cells and inter-cell switching circuits of driver circuit 10 receive control signals as schematically described in FIG. 3B except that there is an overall time shift among different cells. Thus, control signals are firstly transmitted to operate the last cell 12n and inter-cell switching circuit 14n, secondly to operate cell $12_{n-1}$ and inter-cell switching circuit $14_{n-1}$, and so on. A set of control signals suitable for the entire driver circuit according to some embodiments of the present disclosure is illustrated in FIG. 3C. The notations in FIG. 3C are similar to the notations used in FIG. 2C above.

As shown, switches 22, 24 and 38 are reclosed to initiate the fall-off period of the cycle to restore the original voltage. Yet, it is not necessary to transmit another control pulse to switch 36 after the buildup period, since switch 36, as stated, is closed only once, and optionally for a relatively short period of time, during a single voltage boost cycle.

Figure 4:
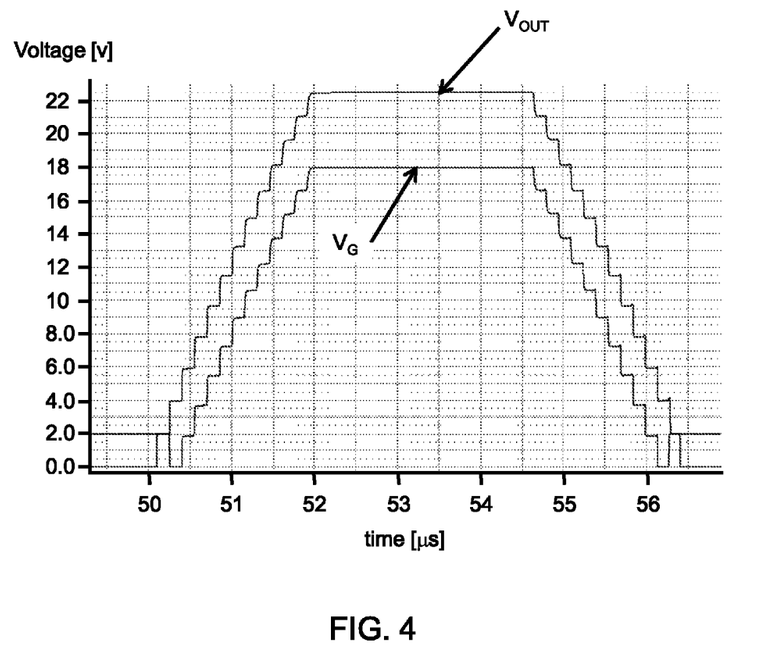
FIG. 4 is a graph of voltages, in volts, as a function of the time, in microseconds, showing an output voltage of the last cell of the driver circuit, according to some embodiments of the present disclosure.

FIG. 4 is a graph of voltages, in volts, as a function of the time, in microseconds, showing $V_{OUT}$ (the output voltage of the last cell of driver circuit 10) and the gate voltage $V_G$ of the transistor 32 of the last inter-cell switching circuit. The graph was generated in an experiment employing 15 cells in driver circuit 10 in which $V_{DD}$ was set to 2 v. As shown, the output voltage is more than an order of magnitude higher than the supply voltage.

The value of $V_{OUT}$ optionally and preferably does not exceed the maximal voltage that switches 22 can maintain without being damaged. For example, when switches 22 are embodied as transistors (see FIG. 5B, below), the value of $V_{OUT}$ optionally and preferably does not exceed the maximal source-drain voltage that the transistors 22 can maintain without being damaged.

Figure 5A:
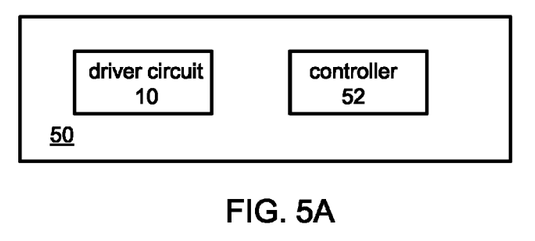
FIGS. 5A and 5B are schematic illustrations of a voltage boosting system, according to some embodiments of the present disclosure.
Figure 5B:
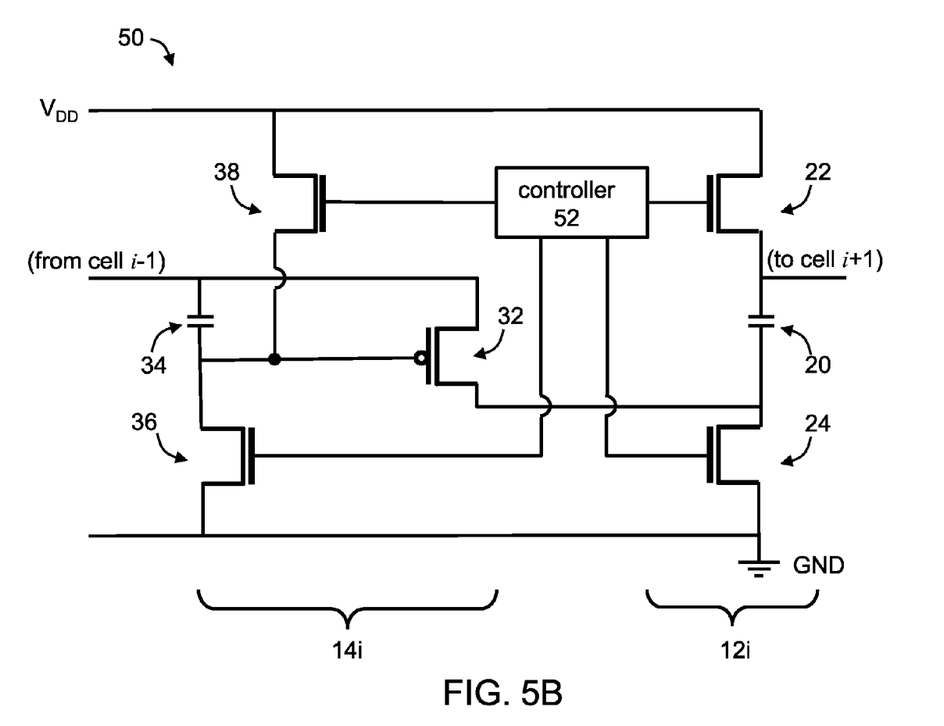

Reference is now made to FIGS. 5A-B which are schematic illustrations of a voltage boosting system 50, according to some embodiments of the present disclosure.

Voltage boosting system 50 generally comprises driver circuit 10, as further detailed hereinabove and a controller 52 configured for transmitting synchronized control signals to cells 12 and inter-cell switching circuits 14 of driver circuit 10. The transmitted signals serve for connecting and disconnecting cells 14 to voltage supply terminal $V_{DD}$, and for connecting and disconnecting cells 14 from each other. A more detailed diagram of system 50 is illustrated in FIG. 5B, showing, for clarity of presentation, only a single cell circuit 14 (the ith cell) and a single inter-cell switching circuit 14 (establishing connection between cell i−1 and the ith cell).

Figure 6:
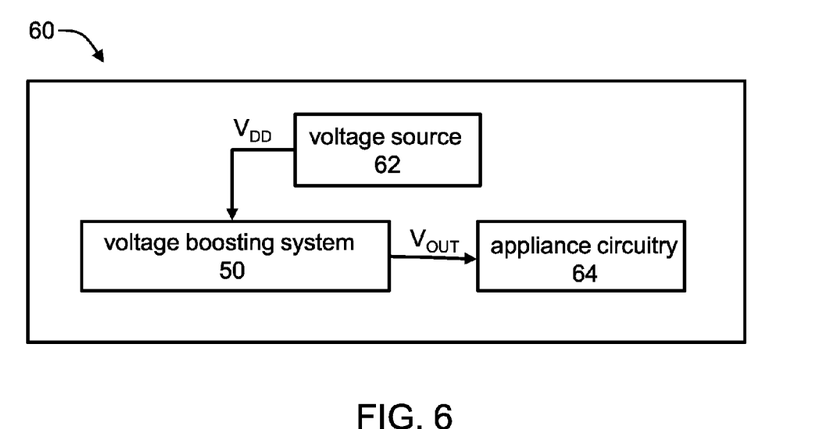
FIG. 6 is a schematic illustration of an appliance system, according to some embodiments of the present disclosure.

FIG. 6 is a schematic illustration of an appliance system 60 employing voltage boosting system 50, according to some embodiments of the present disclosure. Appliance system generally comprises a voltage source 62, voltage boosting system 50 and an appliance circuitry 64. Voltage source 62 typically supplies a supply voltage $V_{DD}$ that is lower than the minimum voltage $V_{MIN}$ required for operating circuitry 64 of appliance system 60. Voltage boosting system 50 boosts the supply voltage $V_{DD}$ to an output voltage $V_{OUT}$ which is used by circuitry 64. The number and configurations of cells 12 and inter-cell switches of system 40 are selected such that $V_{OUT}$ is at least the minimum voltage $V_{MIN}$, so that appliance system 60 is operated by a suitable voltage.

Appliance system 60 can be any appliance that requires voltage boost, including, without limitation, an electrostatic pen system for a touch screen, a memory system, a laser pointer system, and a camera having a flash lamp. Other types of appliances are also contemplated.

As used herein the term "about" refers to ±10%.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this disclosure may be presented in a range format. It should be understood that the description in range format is merely for convenience and brevity and should not be construed as an inflexible limitation on the scope of the disclosure. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

According to some embodiments there is provided a driver circuit for voltage boosting. The driver circuit comprises: a plurality of circuit cells, each configured to amplify voltage applied thereto; and a plurality of inter-cell switching circuits, arranged to controllably concatenate the cells in series such that, for any pair of adjacent cells, voltage amplified by one cell of the pair is applied, via a respective inter-cell switching circuit, to another cell of the pair; wherein at least one of the inter-cell switching circuits comprises a transistor and a capacitor connected in parallel to each other such that a source-gate voltage of the transistor equals a voltage drop on the capacitor at all times.

According to some embodiments there is provided a switching circuit for a voltage boost driver. The switching circuit comprises a transistor, a capacitor connected between a gate terminal and a source terminal of the transistor, and an arrangement of switches for connecting the source terminal to a reference line at a reference potential and the gate terminal to a supply line at supplying a voltage relative to the reference potential.

According to some embodiments the capacitor has a capacitance of from about 1 pF to about 10 pF.

According to some embodiments voltage supply terminal supplies voltage of from about 1 volt to about 5 volts.

According to some embodiments at least one of the circuit cells comprises an intra-cell capacitor, wherein at least one of the capacitor of the at least one inter-cell switching circuit and the intra-cell capacitor of the at least one circuit cell is in a well selected from the group consisting of an n-well and a p-well.

According to some embodiments, the driver circuit is part of a voltage boosting system, wherein the driver circuit further comprises a controller for transmitting synchronized control signals to the cells for connecting and disconnecting the cells to a voltage supply terminal, and to the inter-cell switching circuits for connecting and disconnecting the cells from each other.

According to some embodiments, the voltage boosting system is part of an electrostatic pen system for a touch screen.

According to some embodiments, the voltage boosting system is part of a memory system.

According to some embodiments, the voltage boosting system is part of a laser pointer system.

According to some embodiments, the voltage boosting system is part of a flash lamp in a camera.

According to some embodiments there is provided a method of boosting voltage supplied by a voltage source via a voltage supply terminal. The method comprises: transmitting synchronized control signals to: (i) a plurality of circuit cells, for connecting and disconnecting the cells to the voltage supply terminal, and (ii) a plurality of inter-cell switching circuits, for connecting and disconnecting the cells from each other. Each circuit cells is configured to amplify voltage applied thereto, wherein for any pair of adjacent cells, voltage amplified by one cell of the pair is applied, via at least one of the inter-cell switching circuits, to another cell of the pair. At least one of the inter-cell switching circuits optionally comprises a transistor and a capacitor connected in parallel to each other such that a source-gate voltage of the transistor equals a voltage drop on the capacitor at all times.

According to some embodiments each circuit cell comprises an intra-cell switch for controllably charging the cell by electrical charge prior to the application of the voltage.

According to some embodiments voltage across capacitors of the inter-cell switching circuits increases along the series.

According to some embodiments the at least one inter-cell switching circuit comprises a first switch configured to controllably discharge the capacitor and a second switch configured to controllably charge the capacitor.

According to some embodiments a first terminal of the capacitor is connected to a voltage supply terminal of the one cell of the pair via the first switch and to a reference point via the second switch, and wherein an input voltage terminal of the one cell of the pair is connected to a second terminal of the capacitor.

According to some embodiments the method is used to boost a supply voltage to a voltage which is at least a minimum voltage required for operating an appliance system.

Certain features of the examples described herein, which are, for clarity, described in the context of separate embodiments, may also be provided in combination in a single embodiment. Conversely, various features of the examples described herein, which are, for brevity, described in the context of a single embodiment, may also be provided separately or in any suitable sub-combination or as suitable in any other described embodiment of the disclosure. Certain features described in the context of various embodiments are not to be considered essential features of those embodiments, unless the embodiment is inoperative without those elements.

What is claimed is:

1. A driver circuit for voltage boosting, the driver circuit comprising:
   a plurality of circuit cells, each configured to amplify voltage applied thereto; and
   a plurality of inter-cell switching circuits, arranged to controllably concatenate the cells in series such that, for any pair of adjacent cells, voltage amplified by one cell of the pair is applied, via a respective inter-cell switching circuit, to another cell of the pair;
   wherein at least one of said inter-cell switching circuits comprises a transistor and a capacitor connected in parallel to each other such that a source-gate voltage of the transistor equals a voltage drop on the capacitor at all times.

2. The driver circuit according to claim 1, wherein each circuit cell comprises an intra-cell switch for controllably charging the circuit cell by electrical charge prior to the application of the voltage.

3. The driver circuit according to claim 1, wherein voltage across capacitors of the inter-cell switching circuits increases along the series.

4. The driver circuit according to claim 1, wherein the at least one inter-cell switching circuit comprises a first switch configured to controllably discharge the capacitor and a second switch configured to controllably charge the capacitor.

5. The driver circuit according to claim 4, wherein a first terminal of the capacitor is connected to a voltage supply terminal of the one cell of the pair via the first switch and to a reference point via the second switch, and wherein an input voltage terminal of the one cell of the pair is connected to a second terminal of the capacitor.

6. The driver circuit according to claim 5, wherein the capacitor has a capacitance of from about 1 pF to about 10 pF, and the voltage supply terminal supplies voltage of from about 1 volt to about 5 volts.

7. The driver circuit according to claim 1, wherein the capacitor has a capacitance of from about 1 pF to about 10 pF.

8. The driver circuit according to claim 1, wherein at least one of the circuit cells comprises an intra-cell capacitor, and wherein at least one of the capacitor of the at least one inter-cell switching circuit and the intra-cell capacitor of the at least one circuit cell is in a well selected from the group consisting of an n-well and a p-well.

9. The driver circuit according to claim 1, wherein the driver circuit is part of a voltage boosting system, and wherein the driver circuit further comprises a controller for transmitting synchronized control signals to the cells for connecting and disconnecting the cells to a voltage supply terminal, and to the inter-cell switching circuits for connecting and disconnecting the cells from each other.

10. The driver circuit according to claim 9, wherein the voltage boosting system is part of an electrostatic pen system for a touch screen.

11. The driver circuit according to claim 9, wherein the voltage boosting system is part of a memory system.

12. The driver circuit according to claim 9, wherein the voltage boosting system is part of a laser pointer system.

13. The driver circuit according to claim 9, wherein the voltage boosting system is part of a flash lamp in a camera.

14. A method of boosting voltage supplied by a voltage source via a voltage supply terminal, the method comprising:
   transmitting synchronized control signals to: (i) a plurality of circuit cells, for connecting and disconnecting the cells to the voltage supply terminal, and (ii) a plurality of inter-cell switching circuits, for connecting and disconnecting the cells from each other;
   wherein each circuit cell is configured to amplify voltage applied thereto;
   wherein for any pair of adjacent cells, voltage amplified by one cell of the pair is applied, via at least one of the inter-cell switching circuits, to another cell of the pair; and wherein at least one of the inter-cell switching circuits comprises a transistor and a capacitor connected in parallel to each other such that a source-gate voltage of the transistor equals a voltage drop on the capacitor at all times.

15. The method according to claim 14, wherein each circuit cell comprises an intra-cell switch for controllably charging the circuit cell by electrical charge prior to the application of the voltage.

16. The method according to claim 14, wherein voltage across capacitors of the inter-cell switching circuits increases along the series.

17. The method according to claim 14, wherein the at least one inter-cell switching circuit comprises a first switch configured to controllably discharge the capacitor and a second switch configured to controllably charge the capacitor.

18. The method according to claim 17, wherein a first terminal of the capacitor is connected to a voltage supply terminal of the one cell of the pair via the first switch and to a reference point via the second switch, and wherein an input voltage terminal of the one cell of the pair is connected to a second terminal of the capacitor.

19. The method according to claim 14, wherein the method is used to boost a supply voltage to a voltage which is at least a minimum voltage required for operating an appliance system.

* * * * *

UNITED STATES PATENT AND TRADEMARK OFFICE
CERTIFICATE OF CORRECTION

PATENT NO. : 9,678,523 B2
APPLICATION NO. : 14/883671
DATED : June 13, 2017
INVENTOR(S) : Ran Sahar It is certified that error appears in the above-identified patent and that said Letters Patent is hereby corrected as shown below:

On the Title Page

Item (73) Assignee:
"Redmond, VA (US)":
Should be changed to:
-- Redmond, WA (US) --

Signed and Sealed this
Thirty-first Day of July, 2018

Andrei Iancu
*Director of the United States Patent and Trademark Office*